United States Patent
Petro et al.

(10) Patent No.: US 10,418,248 B2
(45) Date of Patent: Sep. 17, 2019

(54) METHOD OF POLISHING GROUP III-V MATERIALS

(71) Applicant: Cabot Microelectronics Corporation, Aurora, IL (US)

(72) Inventors: Benjamin Petro, Aurora, IL (US); Glenn Whitener, Batavia, IL (US); William Ward, Glen Ellyn, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/433,068

(22) Filed: Feb. 15, 2017

(65) Prior Publication Data

US 2017/0236718 A1    Aug. 17, 2017

Related U.S. Application Data

(60) Provisional application No. 62/295,563, filed on Feb. 16, 2016.

(51) Int. Cl.

| *H01L 21/306* | (2006.01) |
|---|---|
| *C09G 1/02* | (2006.01) |
| *C09K 3/14* | (2006.01) |
| *H01L 29/20* | (2006.01) |
| *H01L 21/02* | (2006.01) |

(52) U.S. Cl.
CPC .......... *H01L 21/30625* (2013.01); *C09G 1/02* (2013.01); *C09K 3/1409* (2013.01); *C09K 3/1436* (2013.01); *H01L 21/02024* (2013.01); *H01L 29/20* (2013.01)

(58) Field of Classification Search
None
See application file for complete search history.

(56) References Cited

U.S. PATENT DOCUMENTS

| 4,428,795 A | 1/1984 | Kohl et al. |
| 8,487,409 B2 | 7/2013 | Okita |
| 2007/0037892 A1 | 2/2007 | Belov |
| 2008/0113589 A1 | 5/2008 | Feeney et al. |
| 2008/0211061 A1* | 9/2008 | Atwater, Jr. ........ H01L 21/2007 257/615 |
| 2011/0223840 A1 | 9/2011 | Morinaga et al. |
| 2015/0380263 A1* | 12/2015 | Lan .......................... C09G 1/02 438/693 |
| 2016/0020087 A1* | 1/2016 | Liu ..................... C11D 11/0047 510/175 |

FOREIGN PATENT DOCUMENTS

| CN | 102010664 A | 4/2011 |
| CN | 103199014 A | 7/2013 |

OTHER PUBLICATIONS

Shivaji Peddeti et al., Chemical Mechanical Polishing of InP, ECS Journal of Solid State Science and Technology, 2012, vol. 1, Issue 4, pp. P184-P189.

Matovu, John Bogere, 2013, Chemical mechanical polishing of Indium phosphide, Gallium arsenide and Indium gallium arsenide films and related environment and safety aspects, (Doctoral dissertation—abstract only), ProQuest Dissertations and Theses; Thesis (Ph.D.)—Clarkson University, 2013.; Publication No. AAT 3602988; ISBN: 9781303570629; Source: Dissertation Abstracts International, vol. 75-03(E), Section: B.; 137 p.

Korean Intellectual Property Office, International Search Report issued in connection with Application No. PCT/US2017/017858 dated Apr. 28, 2017.

* cited by examiner

*Primary Examiner* — Roberts P Culbert
(74) *Attorney, Agent, or Firm* — Thomas Omholt; Erika S. Wilson

(57) ABSTRACT

Disclosed is a method of chemically-mechanically polishing a substrate. The method comprises, consists of, or consists essentially of (a) contacting a substrate containing at least one Group III-V material, with a polishing pad and a chemical-mechanical polishing composition comprising water, abrasive particles having a negative surface charge, and an oxidizing agent for oxidizing the Group III-V material in an amount of from about 0.01 wt. % to about 5 wt. %, wherein the polishing composition has a pH of from about 2 to about 5; (b) moving the polishing pad and the chemical-mechanical polishing composition relative to the substrate; and (c) abrading at least a portion of the substrate to polish the substrate. In some embodiments, the Group III-V material is a semiconductor that includes at least one element from Group III of the Periodic Table and at least one element from Group V of the Periodic Table.

12 Claims, No Drawings

METHOD OF POLISHING GROUP III-V MATERIALS

BACKGROUND OF THE INVENTION

A semiconductor wafer is typically composed of a substrate, such as a silicon wafer, on which a plurality of transistors have been formed. Transistors are chemically and physically connected into the substrate and are interconnected through the use of well known multilevel coplanar interconnects to form functional circuits. Typical multilevel interconnects are comprised of stacked thin-films consisting of, for example, one or more of the following: titanium (Ti), titanium nitrate (TiN), copper (Cu), aluminum (Al), tungsten (W), tantalum (Ta), or any combination thereof.

The traditional technique for forming functional multilevel coplanar interconnects has involved planarizing the surface of the interconnects via chemical-mechanical polishing (CMP). CMP involves the concurrent chemical and mechanical polishing of an overlying first layer to expose the surface of a non-planar second layer on which the first layer has been formed.

CMP compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

Because of the desire for faster devices in the microelectronics industry, there is an interest in using elements from Groups III-V of the Periodic Table because of their high electron mobility. The rapid electron transport offered by the Group III-V materials allows for greater electrical conductivity in smaller features (i.e., allowing for advanced-node integrated circuits) as compared with copper which suffers from much lower electron mobility and is limited in application to larger features.

A significant challenge with using Group III-V materials in the microelectronics industry is achieving a smooth and planar surface to enable further processing. Effective planarization with good removal rates of Group III-V materials is difficult to achieve because of smaller feature size and material selectivity requirements for front-end advanced nodes. Another challenge with using Group III-V materials in semiconductor wafers is that during planarization, the Group III-V materials are susceptible to producing toxic outgases, which can be irritating, flammable, and even poisonous. For example, a toxic gaseous hydride species can be produced such as arsine ($AsH_3$) or phosphine ($PH_3$). These gases are a significant hazard. Conventional approaches have required the need to handle the post CMP slurry contaminated waste through ventilation systems, which are cumbersome and costly.

Thus, there remains a need in the art for polishing compositions and methods that can provide desirable polishing performance including effective removal rates of the Group III-V materials. It is also desired to provide effective polishing performance of Group III-V materials while controlling the output of toxic outgases.

BRIEF SUMMARY OF THE INVENTION

The invention provides a method of chemically-mechanically polishing a substrate. The method comprises, consists of, or consists essentially of (a) contacting a substrate containing at least one Group III-V material, with a polishing pad and a chemical-mechanical polishing composition comprising water, abrasive particles having a negative surface charge, and an oxidizing agent for oxidizing the Group III-V material in an amount of from about 0.01 wt. % to about 5 wt. %, wherein the polishing composition has a pH of from about 2 to about 5; (b) moving the polishing pad and the chemical-mechanical polishing composition relative to the substrate; and (c) abrading at least a portion of the substrate to polish the substrate. In some embodiments, the Group III-V material is a semiconductor that includes at least one element from Group III of the Periodic Table and at least one element from Group V of the Periodic Table.

DETAILED DESCRIPTION OF THE INVENTION

Embodiments of the invention provide a method of chemically-mechanically polishing a substrate such as a semiconductor wafer. The method comprises, consists of, or consists essentially of (a) contacting a substrate containing at least one Group III-V material, with a polishing pad and a chemical-mechanical polishing composition comprising water, abrasive particles having a negative surface charge, and an oxidizing agent for oxidizing the Group III-V material in an amount of from about 0.01 wt. % to about 5 wt. %, wherein the polishing composition has a pH of from about 2 to about 5; (b) moving the polishing pad and the chemical-mechanical polishing composition relative to the substrate; and (c) abrading at least a portion of the substrate to polish the substrate.

The inventive method has particular utility with substrates containing Group III-V materials. In preferred embodiments, the Group III-V material is a semiconductor material, e.g., that can be used in the form of a semiconductor wafer so that an integrated circuit (IC) can be formed on the wafer, which is a substrate for the microelectronic devices built in and over the wafer. IC's are compact and contain billions of transistors and other electrical components on the wafer. Group III-V semiconductor materials advantageously exhibit rapid electron transport, thereby allowing for conducting electricity in smaller features as compared with other materials such as copper or tungsten. For example, the Group III-V material can include one or more of the elements from the Main Group elements on the Periodic Table, particularly Group IIIA (B, Al, Ga, In, Tl), Group IVA (C, Si, Ge, Sn, Pb), and/or Group VA (N, P, As, Sb, Bi), or any combination thereof. In preferred embodiments, the Group III-V material includes Si, In, P, Ga, As, Ge, or any combination thereof.

In some embodiments, the Group III-V material includes at least one element from Group IIIA of the Periodic Table and at least one element from Group VA of the Periodic Table. The Group III-V material can be in the form of any suitable semiconductor material, including compounds such as GaAs, AlAs, GaN, AlN, InN, GaInP, SiGe, InGaAs, InP, or any combination thereof. In some embodiments, the Group III-V material includes GaAs, InGaAs, InP, or any combination thereof. If desired, the Group III-V material can be in a layer over another layer that may include silicon oxide, silicon nitride, polysilicon, or other pre-selected material.

The inventive method surprisingly and unexpectedly achieves removal and good selectivity of the Group III-V material by polishing with a polishing composition exhibiting a pH of from about 2 to about 5 and using abrasive particles with a negative surface charge. While not wishing to be bound by any particular theory, the inventors have found that the acidic pH range recited herein in combination with the negative surface charge of the particles is desirable because of favorable electrostatic attraction in view of the inherent positive charge on the III-V material surface at these acidic pH's, thereby enhancing the desired removal.

In some embodiments, the pH of the polishing composition is, e.g., from about 2 to about 4.5, from about 2 to about 4, from about 2 to about 3.5, from about 2 to about 3, from about 2 to about 2.5, from about 2.3 to about 5, from about 2.3 to about 4.5, from about 2.3 to about 4, from about 2.3 to about 3.5, from about 2.3 to about 3, from about 2.5 to about 5, from about 2.5 to about 4.5, from about 2.5 to about 4, from about 2.5 to about 3.5, from about 2.5 to about 3, from about 2.7 to about 5, from about 2.7 to about 4.5, from about 2.7 to about 4, from about 2.7 to about 3.5, from about 2.7 to about 3, from about 3 to about 5, from about 3 to about 4.5, from about 3 to about 4, or from about 3 to about 3.5.

Because of the advantage of high electron mobility provided by Group III-V materials, the Group III-V materials can be used to produce advanced node semiconductor wafers. Thus, in some embodiments, the inventive method is particularly suited for use with advanced node applications (e.g., technology nodes of 28 nm or less, 22 nm or less, 18 nm or less, 16 nm or less, 14 nm or less, 10 nm or less, 8 nm or less, 6 nm or less, etc.). However, the wafers can be of conventional node configuration in some embodiments, e.g., technology nodes of 65 nm or less, 45 nm or less, 32 nm or less, etc.

The polishing composition comprises an abrasive. The abrasive desirably exhibits a negative surface charge within the desired pH range of 2 to 5 (or desired pH sub-range set forth herein). Negatively charged particles are desirable because they have favorable charge attraction between the particle surface and Group III-V material of interest within the desired pH range set forth herein, during polishing. For example, in some embodiments, the abrasive particles have a zeta potential of at least about −5 mV. In some embodiments, the abrasive particles have a zeta potential of from about −10 mV to about −60 mV, e.g., from about −10 mV to about −50 mV, from about −20 mV to about −40 mV, from about −30 mV to about −40 mV, or from about −20 mV to about −30 mV.

In some embodiments, the abrasive particles comprise, consist, or consist essentially of colloidal silica particles. As known to one of ordinary skill in the art, colloidal silicas are suspensions of fine amorphous, nonporous and typically spherical particles in a liquid phase. The colloidal silica can take the form of condensation-polymerized or precipitated silica particles. In some embodiments, the silica is in the form of wet-process type silica particles. The particles, e.g., colloidal silica, can have any suitable average size (i.e., average particle diameter). If the average abrasive particle size is too small, the polishing composition may not exhibit sufficient removal rate. In contrast, if the average abrasive particle size is too large, the polishing composition may exhibit undesirable polishing performance such as, for example, poor substrate defectivity. Accordingly, the abrasive particles (e.g., colloidal silica) can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the abrasive can have an average particle size of about 200 nm or less, for example, about 175 nm or less, about 150 nm or less, about 125 nm or less, about 100 nm or less, about 75 nm or less, about 50 nm or less, or about 40 nm or less. Thus, the abrasive can have an average particle size bounded by any two of the aforementioned endpoints.

For example, the abrasive can have an average particle size of about 10 nm to about 200 nm, about 20 nm to about 200 nm, about 20 nm to about 175 nm, about 20 nm to about 150 nm, about 25 nm to about 125 nm, about 25 nm to about 100 nm, about 30 nm to about 100 nm, about 30 nm to about 75 nm, about 30 nm to about 40 nm, or about 50 nm to about 100 nm. For non-spherical abrasive particles, the size of the particle is the diameter of the smallest sphere that encompasses the particle. The particle size of the abrasive can be measured using any suitable technique, for example, using laser diffraction techniques. Suitable particle size measurement instruments are available from e.g., Malvern Instruments (Malvern, UK).

The abrasive particles (e.g., colloidal silica) preferably are colloidally stable in the polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The abrasive is present in any suitable amount. If the polishing composition of the invention comprises too little abrasive, the composition may not exhibit sufficient removal rate. In contrast, if the polishing composition comprises too much abrasive then the polishing composition may exhibit undesirable polishing performance and/or may not be cost effective and/or may lack stability. The polishing composition can comprise about 10 wt. % or less of abrasive, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less of abrasive, or about 0.5 wt. % or less of abrasive. Alternatively, or in addition, the polishing composition can comprise about 0.01 wt. % or more, 0.05 wt. % or more, for example, about 0.1 wt. % or more about 0.2 wt. % or more, about 0.3 wt. % or more, about 0.4 wt. % or more, about 0.5 wt. % or more, or about 1 wt. % or more of abrasive. Thus, the polishing composition can comprise abrasive in an amount bounded by any two of the aforementioned endpoints, as appropriate.

For example, in some embodiments, the abrasive can be present in an amount of from about 0.01 wt. % to about 10 wt. % of the polishing composition, e.g., about 0.01 wt. % to about 8 wt. %, about 0.01 wt. % to about 6 wt. %, about 0.01 wt. % to about 5 wt. %, about 0.01 wt. % to about 4 wt. %, about 0.01 wt. % to about 2 wt. %, about 0.01 wt. % to about 1 wt. %, about 0.05 wt. % to about 8 wt. %, about 0.05 wt. % to about 6 wt. %, about 0.05 wt. % to about 5 wt. %, about 0.05 wt. % to about 4 wt. %, about 0.05 wt. % to about 2 wt. %, about 0.05 wt. % to about 1 wt. %, about 0.1 wt. % to about 10 wt. %, about 0.1 wt. % to about 8 wt. %, about 0.1 wt. % to about 6 wt. %, about 0.1 wt. % to about 5 wt. %, about 0.1 wt. % to about 4 wt. %, about 0.1 wt. % to about 2 wt. %, about 0.1 wt. % to about 1 wt. %, about 0.5 wt. % to about 10 wt. %, about 0.5 wt. % to about 8 wt. %, about 0.5 wt. % to about 5 wt. %, about 0.5 wt. % to about 4 wt. %, about 0.5 wt. % to about 2 wt. %, about 0.5 wt. % to about 1 wt. %, about 1 wt. % to about 10 wt. %, about 1 wt. % to about 8 wt. %, about 1 wt. % to about 6 wt. %, about 1 wt. % to about 5 wt. %, about 1 wt. % to about 4 wt. %, about 1 wt. % to about 2 wt. %, etc.

The polishing composition comprises an oxidizing agent that oxidizes the Group III-V material. The oxidizing agent can be any suitable oxidizing agent having an oxidation potential of sufficient magnitude at the pH of the polishing composition to oxidize the Group III-V material. The oxidation of the Group III-V material is desirable because it rapidly converts the III-V metal to an abradable oxide film for CMP application. In a preferred embodiment, the oxidizing agent is hydrogen peroxide. Non-limiting examples of suitable oxidizing agents include oxidizing agents selected from hydrogen peroxide, an amine oxide, a quinone, peroxy carboxylic acid, hypervalent oxyhalide, persulfate, redox-active metal ion (such as $Ce^{4+}$ or $Fe^{3+}$) or coordination complex thereof, or any combination thereof. Preferably, the oxidizing agent is hydrogen peroxide in some embodiments.

The oxidation agent is present in any suitable amount. If the polishing composition of the invention comprises too little oxidation agent, the composition may not exhibit good planarity and selectivity because an abradable metal oxide layer will not be formed in a uniform manner. In contrast, if the polishing composition comprises too much oxidation agent then the polishing composition may exhibit undesirable planarity and selectivity because the metal oxide layer will be too passivated and inhibit polishing. The polishing composition can comprise about 1 wt. % or less of oxidation agent, for example, about 0.9 wt. % or less, about 0.8 wt. % or less, about 0.7 wt. % or less, about 0.6 wt. % or less, about 0.5 wt. % or less, about 0.4 wt. % or less, about 0.3 wt. % or less, about 0.2 wt. % or less, about 0.1 wt. % or less of oxidation agent. Alternatively, or in addition, the polishing composition can comprise about 0.01 wt. % or more, 0.05 wt. % or more, for example, about 0.1 wt. % or more, about 0.15 wt. % or more, about 0.2 wt. % or more, about 0.25 wt. % or more, about 0.3 wt. % or more, about 0.4 wt. % or more, about 0.5 wt. % or more, or about 1 wt. % or more of oxidation agent. Thus, the polishing composition can comprise oxidation agent in an amount bounded by any two of the aforementioned endpoints, as appropriate.

For example, in some embodiments, the oxidation agent can be present in an amount of from about 0.01 wt. % to about 1 wt. % of the polishing composition, e.g., about 0.01 wt. % to about 0.8 wt. %, about 0.01 wt. % to about 0.6 wt. %, about 0.01 wt. % to about 0.5 wt. %, about 0.01 wt. % to about 0.4 wt. %, about 0.01 wt. % to about 0.2 wt. %, about 0.01 wt. % to about 0.1 wt. %, about 0.05 wt. % to about 1 wt. %, about 0.05 wt. % to about 0.8 wt. %, about 0.05 wt. % to about 0.5 wt. %, about 0.05 wt. % to about 0.4 wt. %, about 0.05 wt. % to about 0.2 wt. %, about 0.05 wt. % to about 0.1 wt. %, about 0.1 wt. % to about 1 wt. %, about 0.1 wt. % to about 0.8 wt. %, about 0.1 wt. % to about 0.6 wt. %, about 0.1 wt. % to about 0.5 wt. %, about 0.1 wt. % to about 0.4 wt. %, about 0.1 wt. % to about 0.2 wt. %, about 0.15 wt. % to about 1 wt. %, about 0.15 wt. % to about 0.8 wt. %, about 0.15 wt. % to about 0.6 wt. %, about 0.15 wt. % to about 0.5 wt. %, about 0.15 wt. % to about 0.4 wt. %, about 0.15 wt. % to about 0.2 wt. %, about 0.2 wt. % to about 1 wt. %, about 0.2 wt. % to about 0.8 wt. %, about 0.2 wt. % to about 0.6 wt. %, about 0.2 wt. % to about 0.5 wt. %, about 0.2 wt. % to about 0.4 wt. %, about 0.25 wt. % to about 1 wt. %, about 0.25 wt. % to about 5 wt. %, etc.

The polishing composition can optionally include a pH adjustor in an effective amount to obtain a desired pH as set forth herein. Suitable pH adjustors are known in the art and include, for example, carboxylic acids such as acetic acid, nitric acid, mineral acids, Lewis or Arrhenius acids, or any combination thereof, or, bases, such as, potassium hydroxide, amines, Lewis or Arrhenius bases, or any combination thereof. If included, the pH adjustor can be included in any suitable amount, such as, for example, from about 0.005 wt. % to about 1 wt. %, e.g., from about 0.01 wt. % to about 1 wt. %, or from about 0.1 wt. % to about 1 wt. %.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

The biocide, when present, can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

It will be understood that any of the components of the polishing composition that are acids, bases, or salts (e.g., organic carboxylic acid, base, and/or alkali metal carbonate, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., abrasive, oxidizing agent, and/or any optional additive) as well as any combination of ingredients (e.g., abrasive, oxidizing agent, optional additive, etc.).

For example, the polishing composition can be prepared by (i) providing all or a portion of the liquid carrier, (ii) dispersing the abrasive (e.g., colloidal silica), oxidizing agent, optional pH adjustor, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., liquid carrier, oxidizing agent, optional pH adjustor, and/or any optional additive) in a (e.g., colloidal silica) slurry, (ii) providing one or more components in an additive solution (e.g., liquid carrier, oxidizing agent, optional pH adjustor, and/or any optional additive), (iii) combining the (e.g., colloidal silica) slurry and the additive solution to form a mixture, (iv) optionally adding suitable amounts of any other optional additives to the mixture, and (v) adjusting the pH of the mixture as appropriate.

The polishing composition can be supplied as a one-package system comprising a abrasive (e.g., colloidal silica), oxidizing agent, optional pH adjustor, and/or any optional additive, and water. Alternatively, the polishing composition of the invention is supplied as a two-package system comprising a (e.g., colloidal silica) slurry and an additive solution, wherein the (e.g., colloidal silica) slurry consists essentially of, or consists of an abrasive (e.g., colloidal silica) and/or any optional additive, and water, and wherein the additive solution consists essentially of, or consists of, oxidizing agent, optional pH adjustor, and/or any optional additive. The two-package system allows for the adjustment of substrate global flattening characteristics and polishing speed by changing the blending ratio of the two packages, i.e., the (e.g., colloidal silica) slurry and the additive solution.

Various methods can be employed to utilize such a two-package polishing system. For example, the (e.g., colloidal silica) slurry and additive solution can be delivered to the polishing table by different pipes that are joined and connected at the outlet of supply piping. The (e.g., colloidal silica) slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). The term "flow line" refers to a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., a pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the abrasive, oxidizing agent, optional pH adjustor, and/or any other optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the abrasive (e.g., colloidal silica), oxidizing agent, optional pH adjustor, and/or any other optional additive are at least partially or fully dissolved in the concentrate.

The chemical-mechanical polishing composition can be used to polish any suitable substrate and is especially useful for polishing substrates comprising at least one layer (typically a surface layer) comprised of Group III-V material. In some embodiments, wafers can comprise or consist of, for example, the Group III-V material in combination with metal oxide, metal nitride, metal composite, metal alloy, a low dielectric material, or combinations thereof. Suitable substrates include wafers used in the semiconductor industry. Preferably, the method is effective in abrading at least a portion of the surface of the substrate by removing at least about 10 Å of the group III-V material from the surface of the substrate, e.g., at least about 50 Å, at least about 100 Å, at least about 250 Å, at least about 500 Å, at least about 1000 Å, at least about 2000 Å and at least about 3000 Å. For example, the method is effective in abrading at least a portion of the surface of the substrate in a range of about 10 Å to about 3000 Å, or from about 50 Å to about 1000 Å.

In some embodiments, the method of the invention can be used for polishing substrates that include Group III-V material but also comprise silicon oxide, silicon nitride, and/or polysilicon, e.g., any one, two, or all three of the aforementioned materials. The polishing method in accordance with some embodiments can be used for simultaneous removal of Group III-V material and other material such as silicon oxide, silicon nitride, and/or polysilicon, e.g., in a pattern wafer. Thus, in such embodiments where the substrate contains silicon oxide, silicon nitride, and/or polysilicon, the method is effective in abrading at least a portion of the surface of the substrate by removing a thickness of the Group III-V material in amounts noted above and at least about 0 Å in thickness of silicon oxide, silicon nitride and/or polysilicon from the surface of the substrate, e.g., at least about 10 Å, such as from about 0 Å to about 500 Å, or from about 10 Å to about 250 Å.

In other embodiments, the substrate can be in the form of a wafer, where the Group III-V material is layered upon a film containing another material such as silicon oxide, silicon nitride, and/or polysilicon, such that only the Group III-V material is polished, e.g., in a blanket wafer. Thus, the polishing method can be used to avoid removal of material such as silicon oxide, silicon nitride and/or polysilicon in the layer under the Group III-V material, as desired such that the polishing is known as "stop on" the silicon oxide, silicon nitride and/or polysilicon. Thus, in such embodiments where the substrate further contains silicon oxide, silicon nitride, and/or polysilicon in this manner, the method is effective in abrading at least a portion of the surface of the substrate by removing a thickness of Group III-V material in amounts noted above and less than about 50 Å/min in thickness of silicon oxide, silicon nitride and/or polysilicon from the surface of the substrate, e.g., less than about 10 Å, such as from about 0 Å to about 500 Å, or from about 10 Å to about 100 Å.

After polishing, surface roughness of the polished substrate can be determined. In accordance with some embodiments, the method achieves a polished substrate (e.g., semiconductor wafer) exhibiting a surface roughness, Ra, of about 3 Å or less, e.g., about 2 Å or less, such as from about 1 Å to about 3 Å. "Ra" is the arithmetic average of absolute values of roughness for a given segment or sample, and can be determined by atomic force microscopy. Surface roughness indicates the quality of planarization capability at a given surface comprised of a material or materials. Preferred embodiments of the inventive method resulting in a polished substrate exhibiting desired low roughness are advantageous to build a quality semiconductor device.

The polishing method can be used to polish a substrate containing a Group III-V material while controlling the output of toxic outgases in accordance with some embodiments. Toxic outgases include hydrides such as arsine and phosphine. Group III-V materials have conventionally been thought to be susceptible to producing such toxic outgases because of the kinetic nature of CMP and low solubility of these gases in solution. Preferably, embodiments of the inventive method produce less than about 1500 parts per billion (ppb) of hydride gas, such as arsine or phosphine gas per twelve inch wafer, e.g., less than about 1000 ppb, less than about 750 ppb, less than about 500 ppb, less than about 250 ppb, or less than about 100 ppb, as determined according to in-line hydride gas monitoring. For a smaller scale, e.g., a 1.6 inch×1.6 inch coupon polish, the production of toxic outgases can be below detectable limits, e.g., below about 5 ppb, in some embodiments.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, and Fujibo POLYPAS™ 27. A particularly preferred polishing pad is the EPIC™ D100 pad commercially available from Cabot Microelectronics Corporation. Another preferred polishing pad is the IC1010 pad available from Dow, Inc., and Element™ 6000 and Element™ 9000 commercially available from NexPlanar Corporation.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but, of course, should not be construed as in any way limiting its scope.

Example 1

This example demonstrates the controlled production of toxic outgases by GaAs blanket wafers polished with Polishing Compositions 1A-1D. The blanket wafers were obtained from SEMATECH, Inc. Albany, N.Y. The blanket wafers consisted of pure GaAs material as round wafers with a diameter of 15 cm.

The polishing compositions contained particles in the form of colloidal silica, in the solids amounts indicated in Table 1. The colloidal silica particles had an average particle size of approximately 70 to 85 nm. Some of the polishing compositions also included hydrogen peroxide ($H_2O_2$) as an oxidizing agent for oxidizing the GaAs, as indicated in Table 1. Each of polishing compositions 1A-1D also included 250 ppm of acetic acid as a pH stabilizer. The remainder of each polishing composition was water. Additionally, the pH values of the polishing compositions are listed in Table 1.

In particular, gas monitoring experiments were conducted during the polishing of the pattern wafers of InGaAs, which were polished with Polishing Compositions 1A-1D on a Logitech tabletop polisher, commercially available from Logitech, Ltd. (Glasgow, Scotland). The polishing parameters of the tabletop polisher were: Slurry flow rate 200 mL/min, downforce 1.5 lbs/in$^2$, platen speed 50 rpm, carrier head speed 45 rpm, carrier head sweep frequency 70%, and carrier head sweep amplitude 50%. The polishing on each pattern wafer was carried out for 600 seconds.

Gas monitoring was carried out during the polishing by in-line air sampling. A CM4 Toxic Gas Monitor gas detector, commercially available from Honeywell International, Analytics division, (Lincolnshire, Ill.) was used to determine the amount of arsine ($AsH_3$) in parts per billion (ppb) as a toxic outgas during polishing. The detector was connected to a digital data logger during the polishing, and the arsine produced was measured by hydride tape detection. A reading of 5 ppb is the lowest detection limit such that any values below 5 ppb indicate experimental noise and maybe interpreted as 0 ppb arsine gas. The results are shown in Table 1.

TABLE 1

| Polishing Composition | pH | Colloidal Silica (wt. %) | $H_2O_2$ (wt. %) | Peak $AsH_3$ Level (ppb) | Removal Rate (Å/min) |
|---|---|---|---|---|---|
| 1A | 4.5 | 0.5 | 0 | 1.1 | 25 |
| 1B | 4.5 | 0.5 | 1 | 0 | 2106 |
| 1C | 2.3 | 0.5 | 0 | 0.8 | 32 |
| 1D | 2.3 | 0.5 | 1 | 1.3 | 1217 |

These results demonstrate that polishing compositions 1A-1D polished the GaAs blanket wafers with low toxic outgases, with arsine levels well below 5 ppb. This result was surprising in view of the prior art reporting much higher amounts of outgassing during CMP of III-V materials (for example Peddeti et al., ECS Journal of Solid State Science and Technology, 1(4) pp 184-189 (2012)). Hydrogen peroxide was present in compositions 1B and 1D, but was not present in compositions 1A and 1C, such that the data indicates pH likely the dominant factor for mitigation of toxic outgassing. The pH was 2.3 or 4.5 and the colloidal silica particles had a negative zeta potential of approximately −40 mV. Additionally, the results show that removal rate and detectable outgassing is uncorrelated.

Example 2

This example demonstrates polishing compositions that can polish an InP pattern wafer surface with good planarization and low surface roughness. The pattern wafers were obtained from SEMATECH, Inc. Albany, N.Y. The pattern was formed such that the wafer contained a 160 nm trench oxide depth structure with InP metal fill. The pattern was formed such that the wafer contained a 160 nm silicon oxide trench depth structure with InP metal fill. Each wafer had dimensions was 300 mm scale.

The pattern wafers of InP were polished with Polishing Compositions 2A-2K on a REFLEXION™ CMP apparatus (Applied Materials, Inc., Santa Clara, Calif.). The polishing parameters of the REFLEXION™ process are set forth in Table 2B below. The polishing was conducted for time periods ranging from 45 to 60 seconds.

Polishing compositions were prepared containing colloidal silica particles, having an average particle size of 70 nm, and hydrogen peroxide as an oxidizing agent for oxidizing the InP. Citric acid was used at a concentration of 250 ppm to stabilize pH and final pH adjustment was made with nitric acid or potassium hydroxide, as necessary to reach the desired pH. The remainder of each polishing composition was water. The weight percentages of ingredients and pH values of the polishing compositions are listed in Table 2A.

TABLE 2A

| Polishing Composition | pH | Colloidal Silica (wt. %) | $H_2O_2$ (wt. %) | Rz (Å) | Ra (Å) | Rq (Å) | Rmax (Å) |
|---|---|---|---|---|---|---|---|
| 2A | 3.0 | 0.5 | 0.5 | 89 | 3.4 | 6.5 | 66 |
| 2B | 3.0 | 0.5 | 0.5 | 119 | 3.3 | 6.1 | 56 |
| 2C | 5.0 | 0.5 | 0.5 | 137 | 5.8 | 10.6 | 95 |
| 2D | 3.0 | 2.5 | 0.5 | 63 | 2.3 | 4.4 | 35 |
| 2E | 5.0 | 2.5 | 0.5 | 97 | 3.6 | 6.7 | 62 |
| 2F | 3.0 | 0.5 | 0.5 | 73 | 22.7 | 30.3 | 96 |
| 2G | 2.3 | 0.5 | 0.5 | 7 | 1.3 | 2.3 | 13 |
| 2H | 3.0 | 0.1 | 0.5 | 41 | 8.6 | 12 | 45 |
| 2I | 2.3 | 0.1 | 0.5 | 14 | 4.2 | 6 | 30 |
| 2J | 2.65 | 0.3 | 0.5 | 8 | 1.9 | 2.9 | 17 |
| 2K | 2.65 | 0.3 | 0.5 | 5 | 1.4 | 2.4 | 11 |

TABLE 2B

REFLEXION ™ Process Parameters

| Parameter | Value |
|---|---|
| Retaining Ring Pressure | 31.7 kPa (4.6 psi) |
| Zone 1 | 24.1 kPa |
| Zone 2 | 12.4 kPa |
| Zone 3 | 10.3 kPa |
| Head Speed | 57 rpm |
| Platen Speed | 63 rpm |
| Flow Rate | 200 ml/min |
| Conditioner | Model S8031C7 (Saesol Diamond Ind., Co., Ltd., Korea) |
| Conditioner Downforce | 2.7 kg (6 lb) |
| Conditioning | 12 s ex-situ |
| Polishing Pad | Dow IC1010 ™ polishing pad |

The surface roughness of each InP pattern wafer after polishing was measured by atomic force microscopy (AFM). In particular, a Bruker D5000, commercially available from Bruker AFM Probes, Bruker Corporation, (Camarillo, Calif.) was used to carry out the roughness measurements, which are reported in Table 2A. "Rz" refers to the difference between the average of the ten lowest valleys and ten highest peaks in the sample size, "Ra" refers to the average of the absolute value in the sample size, "Rq" refers to the root mean squared roughness, and "Rmax" refers to the difference between the highest peak and the lowest valley in the sample size. These values can be compared in order to understand the impact of statistical evaluation of the surface roughness relative to the range of valleys and peaks.

After polishing, profilometry indicated that highly effective planarization took place by polishing compositions 2A, 2B, 2D, 2E, 2G, 2J and 2K in view of Ra, for example. In particular, the resulting wafers were observed to. Furthermore, the roughness measurements indicate excellent planarity. As seen in this example, compositions 2A, 2B, 2D, 2E, 2G, 2J and 2K were able to polish the group III-V material with good planarization and low surface roughness, and it is believed that the inventive slurry composition produced these benefits. The presence of oxidation agent (hydrogen peroxide) for oxidizing the group III-V material was believed to be useful for facilitating high rate and high material selectivities.

Example 3

This example demonstrates the effect on removal rate of InGaAs from blanket wafers polished with Polishing Compositions 3A-3M. The blanket wafers were obtained from SEMATECH, Inc. Albany, N.Y. The blanket wafers contained InGaAs on silicon oxide. Each wafer had dimensions of 1.6"×1.6".

In particular, the blanket wafers of InGaAs were polished with Polishing Compositions 3A-3M using a tabletop polisher apparatus. The polishing parameters were as follows: slurry flowrate 160 mL/min, downforce approximately 2.3 PSI, platen speed 120 rpm, head speed 87 rpm, sweep frequency 70%, and sweep amplitude 50%. Polishing compositions were prepared containing colloidal silica particles, having an average particle size of 70 nm, and hydrogen peroxide as an oxidizing agent for oxidizing the InGaAs. Citric acid was used at a concentration of 250 ppm to stabilize pH and final pH adjustment was made with nitric acid or potassium hydroxide, as necessary. The remainder of each polishing composition was water. The weight percentages of ingredients and pH values of the polishing compositions are listed in Table 3.

TABLE 3

| Polishing Composition | pH | Colloidal Silica Type | Colloidal Silica (wt. %) | $H_2O_2$ (wt. %) | Time (sec) | InGaAs Removal Rate (Å) |
|---|---|---|---|---|---|---|
| 3A | 5 | 1 | 1 | 1.22 | 60 | 1137, 1221, 935 |
| 3B | 3 | 1 | 0.5 | 0.5 | 60 | 1306 |
| 3C | 3 | 1 | 0.5 | 3 | 60 | 1316 |
| 3D | 7 | 1 | 0.5 | 3 | 60 | 70 |
| 3E | 7 | 1 | 0.5 | 0.5 | 60 | 160 |
| 3F | 3 | 1 | 2 | 0.5 | 60 | 1316 |
| 3G | 3 | 1 | 2 | 3 | 60 | 1316 |
| 3H | 7 | 1 | 2 | 3 | 120, 60 | 708, 307 |
| 3I | 7 | 1 | 2 | 0.5 | 60 | 337 |
| 3J | 5 | 1 | 1 | 0 | 60 | 63 |
| 3K | 5 | 2 | 1 | 1.22 | 60 | 1316 |

The removal rate performance is shown in Table 3, which indicates removal rate measured in Angstroms (Å) for each of the compositions 3A-3K. These results demonstrate a high removal rate for inventive compositions containing a pH 5 or less, appropriate colloidal silica loading, and appropriate oxidation agent such as compositions 3A, 3B, 3C, 3F, 3G and 3K. Without wishing to be bound by any particular theory, the presence of oxidation agent (hydrogen peroxide) for oxidizing the group III-V material was believed to be useful for facilitating uniform oxidation of the metal surface. In the inventive compositions, the colloidal silica particles had a zeta potential of approximately −40 mV, and the removal rate results decreased with increasing pH (pH above 5). Results trended less desirable where pH was greater than 5. While not wishing to be bound by any particular theory, this is believed to be due to charge mismatch between the particle and surface or robust passivation of the surface by metal oxide. In addition, the results show colloidal silica type did not significantly impact removal rates (see e.g. 3A and 3K). Both colloidal silicas are treated to carry an anionic charge and have a zeta potential of −30 to −40 mV. Colloidal silica Type 2 has higher roughness on particle surface as compared to Type 1. The charge of these particles in combination with the surface morphology indicates CMP rate performance relies on charge and is less dependant on surface morphology characteristics.

Example 4

This example demonstrates the effect on removal rate of InP from pattern wafers polished with Polishing Compositions 4A-4G. The pattern wafers were obtained from SEMATECH, Inc. Albany, N.Y. The pattern was formed such that the wafer contained a 160 nm silicon oxide trench depth structure with InP metal fill. Each wafer had dimensions of 1.6"×1.6".

The pattern wafers of InP were polished with Polishing Compositions 4A-4G using a tabletop polisher as described in Example 3.

As in Example 3, the polishing compositions were prepared containing one of two types of colloidal silica particles, having an average particle size of about 70 nm. The particles were classified as "Type 1" and "Type 2," with the difference relating to particle morphology and surface chemistry. Type 1 was characterized as having anionic surface treatment, while Type 2 was characterized as having higher surface roughness. Hydrogen peroxide was included as oxidizing agent for oxidizing the InP. Polishing compositions 4B and 4D included a surfactant, while polishing compositions 4A, 4C, and 4E-4G did not include a surfactant. The surfactant was in the form of sodium C14-17 alkyl sec sulfonate, which is commercially available as Hostapur® SAS 30, from Clariant, Ltd., Muttenz, Switzerland. Citric acid was used at a concentration of 250 ppm to stabilize pH and final pH adjustment was made with nitric acid or potassium hydroxide, as necessary. The remainder of each polishing composition was water. The pH of each composition was 5. The weight percentages of ingredients of the polishing compositions are listed in Table 4.

TABLE 4

| Polishing Composition | Time (sec) | pH | Colloidal Silica (wt. %) | Colloidal Silica Type | Surfactant | $H_2O_2$ (wt. %) | Removal Rate |
|---|---|---|---|---|---|---|---|
| 4A | 75, 50 | 5.0 | 1 | 1 | No | 0 | Poor CMP |
| 4B | 50 | 5.0 | 1 | 1 | Yes | 0 | No CMP |
| 4C | 70, 50 | 5.0 | 1 | 2 | No | 0 | Excellent planarization |

TABLE 4-continued

| Polishing Composition | Time (sec) | pH | Colloidal Silica (wt. %) | Colloidal Silica Type | Surfactant | H$_2$O$_2$ (wt. %) | Removal Rate |
|---|---|---|---|---|---|---|---|
| 4D | 50 | 5.0 | 1 | 2 | Yes | 0 | No CMP |
| 4E | 50 | 5.0 | 1 | 2 | No | 1 | Excellent planarization |
| 4F | 50 | 5.0 | 0.5 | 2 | No | 0 | Poor CMP |
| 4G | 50 | 5.0 | 0.5 | 2 | No | 1 | Poor CMP |

The removal rate performance is shown in Table 4, which indicates removal rate in terms of visually observed planarization effect for each of the compositions 4A-4G. These results demonstrate good planarizations for the polishing compositions containing colloidal silica type 2 at pH5, particularly polishing compositions 4C and 4E. Meanwhile, polishing compositions 4A-4B, 4D, and 4F-4G (comparatives) were not effective because lack of H2O2 or too low of solid loading.

As seen in this example, while not wishing to be bound by any particular theory, compositions 4C and 4E were able to achieve highly effective planarization, and it is believed that the solids loading and H$_2$O$_2$ helped produce the improved planarization. In addition, the results show that too low of particle loading in the case of colloidal silica Type 2, impedes planarization performance (4G). The presence of the surfactant impeded planarization (see e.g. 4A vs. 4B and 4C vs. 4D).

Example 5

This example demonstrates the effect on removal rate of InP from blanket wafers polished with Polishing Compositions 5A-5C. The blanket wafers were obtained from SEMATECH, Inc. Albany, N.Y. The blanket wafers contained 600 nm InP deposited on silicon oxide. The blanket wafers of InP were polished with Polishing Compositions 5A-5C using a tabletop polisher apparatus and procedures as described in Example 1. The polishing time was 40 seconds for all three polishing compositions. Slurry flowrate 160 mL/min, downforce 2.3 PSI, platen speed 120 rpm, head speed 87 rpm, sweep frequency 70%, and sweep amplitude 50%.

Polishing compositions were prepared containing one of three types of colloidal silica particles, having an average particle size of approximately 70-85 nm. The particles were classified as "Type 1," "Type 2," and "Type 3" with the differences relating to particle charge and morphology. Type 1 was characterized as having anionic surface treatment, while Type 2 was characterized as having a different surface morphology, and "Type 3" was characterized as having an overall cationic charge. Particle charge differences were due to the surface treatment. "Strongly anionic" in this Example refers to a zeta potential value of at least about −30 mV, while "Slightly anionic" indicates a zeta potential value of approximately −10 mV. Acetic acid was used at a concentration of 250 ppm to stabilize pH and final pH adjustment was made with nitric acid or potassium hydroxide, as necessary. The remainder of each polishing composition was water. The pH of polishing composition 5A was 3.5, while the pH of polishing compositions 5B and 5C was 4. The weight percentages of ingredients and pH values of the polishing compositions are listed in Table 5.

TABLE 5

| Polishing Composition | pH | Particle Size (nm) | Colloidal Silica (wt. %) | Colloidal Silica Type | Particle Charge | H$_2$O$_2$ (wt. %) | Removal (Å) |
|---|---|---|---|---|---|---|---|
| 5A | 3.5 | 85 | 1 | 2 | −25 mV | 0 | 750 |
| 5B | 4 | 110 | 0.5 | 3 | +25 mV | 1 | Very low |
| 5C | 4 | 70 | 0.5 | 1 | −35 mV | 1 | 1000 |

The removal rate performance is shown in Table 5, which indicates the InP removal rate measured in Angstroms (Å) for each of the Compositions 5A-5C. Table 5 also indicates "performance," which is based on scanning-electron microscopy data indicating whether or not polishing occurred and, if "Good", is reflective of low roughness. These results demonstrate good removal rates for the polishing compositions containing polishing abrasives which have anionic charge. While not wishing to be bound by any particular theory, Compositions 5A and 5C were able to achieve good InP removal rate and performance, and it is believed that the particle anionic charge helped produce the improved removal rates. By comparison, polishing Composition 5B (comparative), bearing a cationic surface charge, had low removal and poor performance.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate, the method comprising:
    (a) contacting a substrate containing at least one Group III-V material, and additionally containing silicon oxide, silicon nitride, or polysilicon, or combinations thereof; with a polishing pad and a chemical-mechanical polishing composition consisting essentially of water, colloidal silica abrasive particles having a zeta potential of from about −10 mV to about −60 mV, wherein the colloidal silica abrasive particles have an average particle size of from about 20 nm to about 200 nm, and an oxidizing agent for oxidizing the Group III-V material in an amount of from about 0.01 wt. % to about 5 wt. %, wherein the polishing composition has a pH of from about 2 to about 5;
    (b) moving the polishing pad and the chemical-mechanical polishing composition relative to the substrate; and
    (c) abrading at least a portion of the at least one Group III-V material, as well as the silicon oxide, silicon nitride, or polysilicon, to polish the substrate.

2. The method of claim 1, wherein the Group III-V material contains Si, In, P, Ga, As, Ge, N, or any combination thereof.

3. The method of claim 2, wherein the Group III-V material contains GaAs, AlAs, GaN, AlN, InN, GaInP, SiGe, InGaAs, InP, or any combination thereof.

4. The method of claim 3, wherein the Group III-V material contains GaAs, InGaAs, InP, or any combination thereof.

5. The method of claim 1, wherein the abrasive particles have a zeta potential of from about −20 mV to about −30 mV.

6. The method of claim 1, wherein the abrasive particles are present in an amount of about 0.01 wt. % to about 5 wt. % of the polishing composition.

7. The method of claim 1, wherein the oxidizing agent is hydrogen peroxide, an amine oxide, a quinone, peroxy carboxylic acid, hypervalent oxyhalide, persulfate, redox-active metal ion or coordination complex thereof, or any combination thereof.

8. The method of claim 7, wherein the oxidizing agent is an amine oxide comprising pyridine-N-oxide, trimethylamine-N-oxide, 2-hydroxypyridine N-oxide, 8-hydroxyquinoline N-oxide, picolinic acid N-oxide, pyrazine N-oxide, or any combination thereof.

9. The method of claim 7, wherein the oxidizing agent is a quinone comprising 2,6-dimethoxy-1,4-benzoquinone, 2,6-dimethylbenzoquinone, naphthaquinone, anthraquinone, sulfonated naphthaquinone such as, 1,2-naphthaquinone-4-sulfonic acid, sulfonated anthraquinone such as, anthraquinone-2-sulfonic acid, 1,5-diaminoanthraquinone, catechol, or any combination thereof.

10. The method of claim 7, wherein the oxidizing agent is hydrogen peroxide.

11. The method of claim 1, wherein the oxidizing agent is present in an amount of about 0.01 wt. % to about 1 wt. % of the polishing composition.

12. The method of claim 1, wherein the pH of the composition is from about 2.3 to about 5.

* * * * *